United States Patent
Im et al.

(10) Patent No.: US 11,251,102 B2
(45) Date of Patent: Feb. 15, 2022

(54) SEMICONDUCTOR MODULE INCLUDING HEAT DISSIPATION LAYER

(71) Applicant: Samsung Electronics Co., Ltd., Suwon-si (KR)

(72) Inventors: Yunhyeok Im, Hwaseong-si (KR); Youngsang Cho, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/030,092

(22) Filed: Sep. 23, 2020

(65) Prior Publication Data

US 2021/0296198 A1 Sep. 23, 2021

(30) Foreign Application Priority Data

Mar. 19, 2020 (KR) .................. 10-2020-0033989

(51) Int. Cl.
*H01L 23/36* (2006.01)
*H01L 23/498* (2006.01)
*H01L 23/00* (2006.01)

(52) U.S. Cl.
CPC ............ *H01L 23/36* (2013.01); *H01L 23/498* (2013.01); *H01L 24/27* (2013.01); *H01L 2224/04026* (2013.01)

(58) Field of Classification Search
CPC ....... H01L 23/36; H01L 23/498; H01L 24/27; H01L 2224/04026
See application file for complete search history.

(56) References Cited

U.S. PATENT DOCUMENTS

| 7,696,009 | B2 | 4/2010 | Terui et al. |
| 7,772,046 | B2* | 8/2010 | Pagaila ............... H01L 23/3128 438/127 |
| 8,336,202 | B2 | 12/2012 | Okamoto |
| 2006/0237828 | A1 | 10/2006 | Robinson et al. |
| 2007/0045829 | A1* | 3/2007 | Jeong .................. H01L 23/3121 257/723 |
| 2011/0233756 | A1 | 9/2011 | Khandekar et al. |
| 2013/0264716 | A1* | 10/2013 | Lin .......................... H05K 1/16 257/773 |
| 2015/0181739 | A1* | 6/2015 | Fukuda ................. H01L 23/345 361/728 |
| 2018/0090466 | A1* | 3/2018 | Hung ...................... H01L 23/29 |
| 2018/0269126 | A1 | 9/2018 | Im et al. |
| 2020/0035606 | A1* | 1/2020 | Bhagavat ............ H01L 25/0655 |

FOREIGN PATENT DOCUMENTS

| JP | 5716415 B2 | 5/2015 |
| KR | 1020090077203 A | 7/2009 |
| KR | 101498649 B1 | 3/2015 |
| KR | 1020150033829 A | 4/2015 |

* cited by examiner

*Primary Examiner* — Peniel M Gumedzoe
(74) *Attorney, Agent, or Firm* — Muir Patent Law, PLLC

(57) ABSTRACT

A semiconductor module may include a substrate including a first region and a second region, a first chip mounted in the first region, a second chip and passive devices mounted in the second region, and a heat dissipation layer being in contact with a top surface of the first chip. The heat dissipation layer may be provided on top surfaces and side surfaces of the first chip, the second chip and the passive devices.

20 Claims, 18 Drawing Sheets

SEMICONDUCTOR MODULE INCLUDING HEAT DISSIPATION LAYER

CROSS-REFERENCE TO RELATED APPLICATION

This U.S. non-provisional patent application claims priority under 35 U.S.C. § 119 to Korean Patent Application No. 10-2020-0033989, filed on Mar. 19, 2020, in the Korean Intellectual Property Office, the disclosure of which is hereby incorporated by reference in its entirety.

BACKGROUND

Embodiments of the inventive concepts relate to a semiconductor module and, more particularly, to a semiconductor module including a heat dissipation layer.

An integrated circuit chip may be realized in the form of a semiconductor package so as to be appropriately applied to an electronic product. In a typical semiconductor package, a semiconductor chip may be mounted on a printed circuit board (PCB) and may be electrically connected to the PCB through bonding wires or bumps. As working speeds and capacities of semiconductor packages have been increased, power consumption of the semiconductor packages has also been increased. Thus, thermal characteristics of a semiconductor module including a plurality of semiconductor packages may become important.

SUMMARY

Embodiments of the inventive concepts may provide a semiconductor module with improved durability.

Embodiments of the inventive concepts may also provide a semiconductor module with improved heat dissipation characteristics.

In an aspect, a semiconductor module may include a substrate including a first region and a second region, a first chip mounted in the first region, a second chip and passive devices mounted in the second region, and a heat dissipation layer being in contact with a top surface of the first chip. The heat dissipation layer may be provided on top surfaces and side surfaces of the first chip, the second chip and the passive devices.

In an aspect, a semiconductor module may include a substrate including a first region and a second region, a first chip mounted in the first region, a heat dissipation layer covering the top surface of the first chip, and a second chip and passive devices mounted in the second region. Side surfaces of the heat dissipation layer may be vertically aligned with side surfaces of the first chip, respectively. The heat dissipation layer may include a plurality of particles, and the particles may include silicon carbide (SiC).

In an aspect, a semiconductor module may include a substrate including a first region, a second region, and a third region, the first region laterally disposed between the second region and the third region, a first chip mounted in the third region, a second chip and passive devices mounted in the second region, an electromagnetic blocking wall provided in a region between the first region and the second region of the substrate, first connection parts electrically connecting the first chip to the substrate, second connection parts electrically connecting the second chip to the substrate, third connection parts electrically connecting the passive devices to the substrate, underfills covering the first to third connection parts, a dielectric layer conformally covering top surfaces and side surfaces of the second chip and the passive devices, and a heat dissipation layer covering the dielectric layer, the first chip, and the electromagnetic blocking wall.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
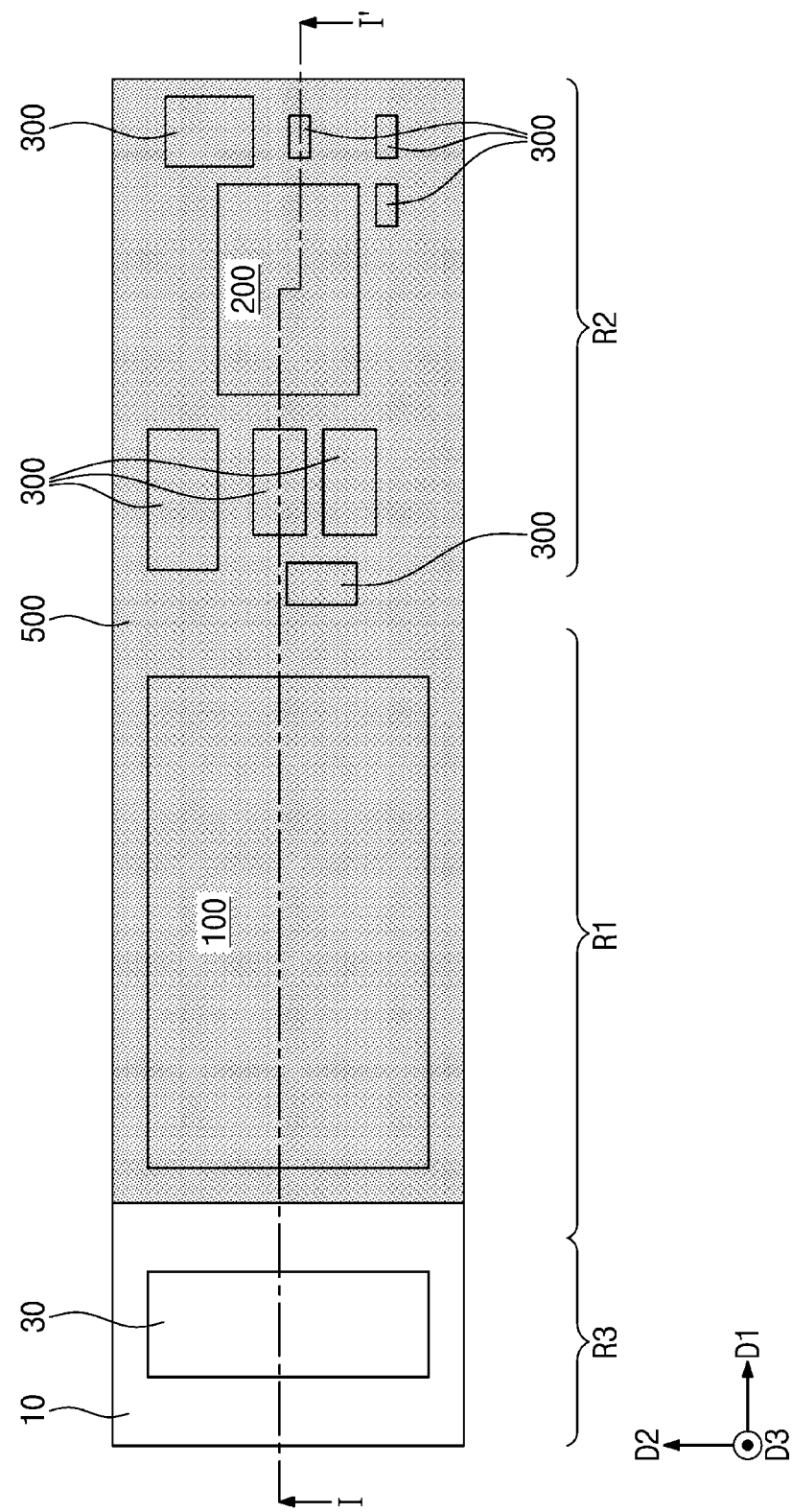
FIG. 1 is a plan view illustrating a semiconductor module according to some embodiments of the inventive concepts.

The same reference numerals or the same reference designators may denote the same elements or components throughout the specification. Semiconductor modules according to some embodiments of the inventive concepts will be described hereinafter.

Figure 2:
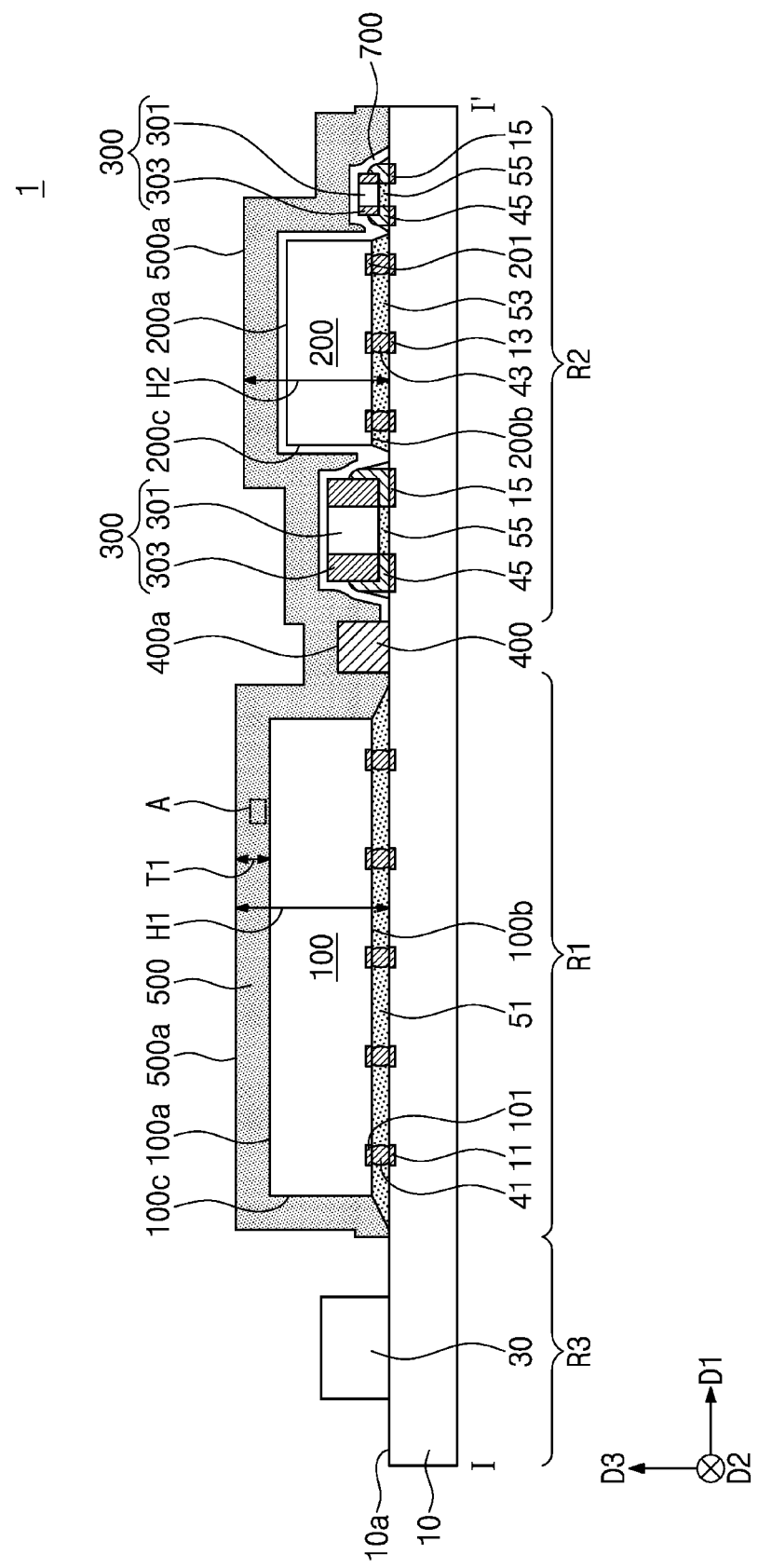
FIG. 2 is a cross-sectional view taken along a line I-I' of FIG. 1 according to example embodiments.
Figure 10:
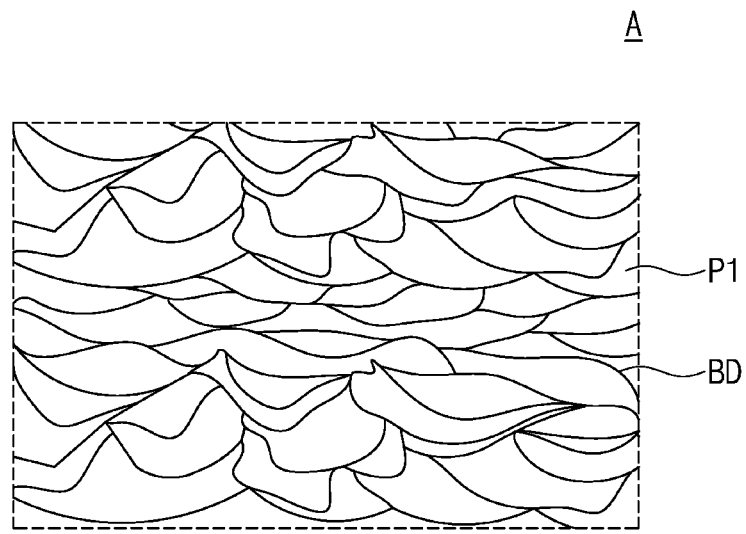
FIG. 10 is an enlarged view of each of regions 'A' of FIGS. 2, 3, 5 and 6 to schematically illustrate a cross section of a heat dissipation layer according to example embodiments.
Figure 11:
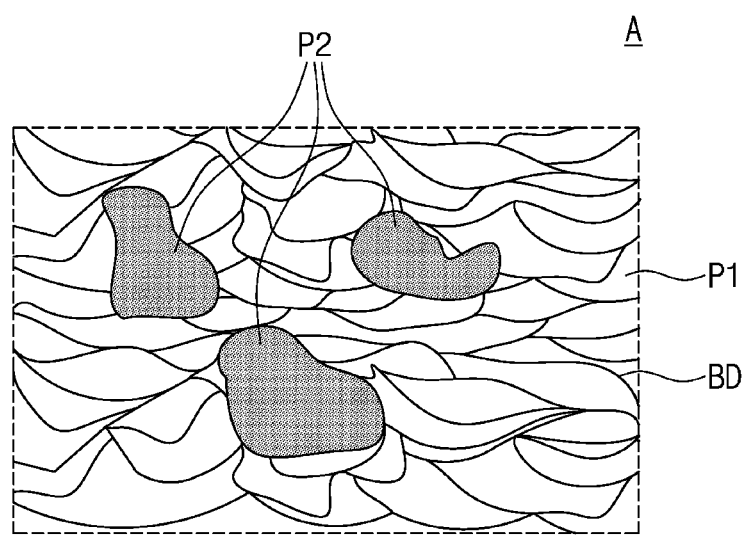
FIG. 11 is an enlarged view of each of regions 'A' of FIGS. 2, 3, 5 and 6 to schematically illustrate a cross section of a heat dissipation layer according to example embodiments.

FIG. 1 is a plan view illustrating a semiconductor module according to some embodiments of the inventive concepts. FIG. 2 is a cross-sectional view taken along a line I-I' of FIG. 1 according to example embodiments. FIG. 10 is an enlarged view of a region 'A' of FIG. 2 to schematically illustrate a cross section of a heat dissipation layer according to example embodiments. FIG. 11 is an enlarged view of a region 'A' of FIG. 2 to schematically illustrate a cross section of a heat dissipation layer according to example embodiments.

Referring to FIGS. 1 and 2, a semiconductor module 1 according to some embodiments of the inventive concepts may include a substrate 10, a first chip 100, a second chip 200, passive devices 300, and a heat dissipation layer 500. The embodiments are described, and illustrated in the drawings, in terms of a semiconductor module. The semiconductor module may be physically implemented by electronic (or optical) circuits such as logic circuits, discrete components, microprocessors, hard-wired circuits, memory elements, wiring connections, and the like, which may be formed together in a single integrated circuit (e.g., as a single semiconductor chip) or as separate integrated circuits and/or discrete components (e.g., several semiconductor chips wired together on a printed circuit board) using semiconductor fabrication techniques and/or other manufacturing technologies.

The substrate 10 may include a first region R1, a second region R2, and a third region R3. The first region R1 may be laterally disposed between the second region R2 and the third region R3. The first region R1 may be a region in which the first chip 100 is mounted. The second region R2 may be a region in which the second chip 200 and the passive devices 300 are mounted. The third region R3 may be a region in which a connection socket 30 is provided. The semiconductor module 1 may be electrically connected to an external device (not shown) through the connection socket 30. For example, the substrate 10 may be a printed circuit board (PCB) having a circuit pattern. The substrate 10 may include first substrate pads 11, second substrate pads 13, and third substrate pads 15 on the top surface 10a of the substrate 10. Hereinafter, "the top surface" of an item or a layer may mean "the topmost surface" of the item or the layer. In some embodiments, the substrate 10 may include an antenna interconnection line therein. A first direction D1 may be parallel to the top surface 10a of the substrate 10. A second direction D2 may be parallel to the top surface 10a of the substrate 10 and may be perpendicular to the first direction D1. A third direction D3 may be perpendicular to the first direction D1 and the second direction D2. In the present specification, it is understood that when an element or component is electrically connected to the substrate 10, it may be electrically connected to the circuit pattern or the antenna interconnection line in the substrate 10.

The first chip 100 may be mounted on the top surface 10a of the substrate 10. The first chip 100 may be disposed in the first region R1 of the substrate 10. The first chip 100 may have a top surface 100a, side surfaces 100c, and a bottom surface 100b. The top surface 100a of the first chip 100 may be a non-active surface. The first chip 100 may include a radio-frequency integrated circuit (RFIC). However, the present invention is not limited thereto, and the first chip 100 may include various types of semiconductor chips. The first chip 100 may include first chip pads 101 on the bottom surface 100b. First connection parts 41 may be disposed between the first chip pads 101 and the first substrate pads 11 of the substrate 10, respectively. The first connection parts 41 may include solder balls, pillars, bumps, or a ball grid array. The first connection parts 41 may include a conductive material, e.g., a metal. For example, the first chip 100 may be electrically connected to the substrate 10 through the first connection parts 41.

A first underfill 51 may be provided in a gap between the substrate 10 and the first chip 100 to surround or seal the first connection parts 41. The first underfill 51 may include an insulating polymer such as an epoxy-based polymer. Bonding reliability of the first connection parts 41 may be improved by the first underfill 51. Unlike FIG. 2, the first underfill 51 may be omitted.

The second chip 200 may be mounted on the top surface 10a of the substrate 10. The second chip 200 may be disposed in the second region R2 of the substrate 10. The second chip 200 may have a top surface 200a, side surfaces 200c, and a bottom surface 200b. The second chip 200 may be a semiconductor chip of which a kind is different from that of the first chip 100. For example, the second chip 200 may include a power management integrated circuit (PMIC) and thus may function as a power management chip. However, the present invention is not limited thereto, and the second chip 200 may include various types of semiconductor chips. The second chip 200 may include second chip pads 201 on the bottom surface 200b. Second connection parts 43 may be disposed between the second chip pads 201 and the second substrate pads 13 of the substrate 10, respectively. The second connection parts 43 may include solder balls, pillars, bumps, or a ball grid array. The second connection parts 43 may include a conductive material, e.g., a metal. For example, the second chip 200 may be electrically connected to the substrate 10 through the second connection parts 43.

A second underfill 53 may be provided in a gap between the substrate 10 and the second chip 200 to surround or seal the second connection parts 43. The second underfill 53 may include an insulating polymer such as an epoxy-based polymer. Bonding reliability of the second connection parts 43 may be improved by the second underfill 53. Unlike FIG. 2, the second underfill 53 may be omitted.

The passive devices 300 may be mounted on the top surface 10a of the substrate 10. The passive devices 300 may be disposed in the second region R2 of the substrate 10. More particularly, the passive devices 300 may be disposed around the second chip 200 when viewed in a plan view. Each of the passive devices 300 may include a pair of electrodes 303 and a body 301. The pair of electrodes 303 may include a conductive material, e.g., a metal. For example, each of the passive devices 300 may include an inductor, a resistor, or a capacitor. Third connection parts 45 may be disposed between the electrodes 303 and the third substrate pads 15 of the substrate 10, respectively. The third connection parts 45 may include solder balls, pillars, bumps, or a ball grid array. The third connection parts 45 may include a conductive material, e.g., a metal. For example, the passive devices 300 may be electrically connected to the substrate 10 through the third connection parts 45.

A third underfill 55 may be provided in a gap between the substrate 10 and each of the passive devices 300 to partially or fully cover the third connection parts 45. The third underfill 55 may include an insulating polymer such as an epoxy-based polymer. Bonding reliability of the third connection parts 45 may be improved by the third underfill 55. Unlike FIG. 2, the third underfill 55 may be omitted.

The heat dissipation layer 500 may be provided on the substrate 10. In some embodiments, the heat dissipation layer 500 may be provided in the first region R1 and the second region R2 of the substrate 10. More particularly, the heat dissipation layer 500 may be provided on the top surfaces and the side surfaces of the first chip 100, the second chip 200 and the passive devices 300. Hereinafter, a structure of the heat dissipation layer 500 will be described in detail.

The heat dissipation layer 500 may be provided on the top surface 100a and the side surfaces 100c of the first chip 100. The heat dissipation layer 500 may cover the top surface 100a of the first chip 100 and may be in contact with the top surface 100a of the first chip 100.

The heat dissipation layer 500 may fully cover the top surface 100a of the first chip 100. The heat dissipation layer 500 may extend from the top surface 100a of the first chip 100 along the side surfaces 100c of the first chip 100 and may be in contact with the top surface 10a of the substrate 10. The heat dissipation layer 500 may cover the side surfaces 100c of the first chip 100 and may be in contact with the side surfaces 100c of the first chip 100. A thickness T1 of the heat dissipation layer 500 provided on the top surface 100a and the side surfaces 100c of the first chip 100 may range from 1 μm to 1 mm. For example, the heat dissipation layer 500 may conformally covering the top surface 100a and the side surfaces 100c of the first chip 100. The heat dissipation layer 500 may fully cover the side surfaces 100c of the first chip 100. The heat dissipation layer 500 may shield the first chip 100 from the outside. For example, the side surfaces 100c of the first chip 100 may be surrounded by the heat dissipation layer 500 when viewed in a plan view.

The heat dissipation layer 500 may be provided on the top surface 200a and the side surfaces 200c of the second chip 200. The heat dissipation layer 500 may fully cover the top surface 200a of the second chip 200. The heat dissipation layer 500 may extend from the top surface 200a of the second chip 200 along the side surfaces 200c of the second chip 200. For example, the heat dissipation layer 500 may cover at least a portion of each of the side surfaces 200c of the second chip 200. The heat dissipation layer 500 may extend from the side surfaces 200c of the second chip 200 onto the top surfaces of the passive devices 300 adjacent to the second chip 200. The heat dissipation layer 500 may cover the top surfaces of the passive devices 300. The heat dissipation layer 500 may fully cover the top surface of each of the passive devices 300. The heat dissipation layer 500 provided on the top surfaces of the passive devices 300 may extend onto the side surfaces of each of the passive devices 300 so as to be in contact with the top surface 10a of the substrate 10.

The heat dissipation layer 500 provided in the first region R1 of the substrate 10 may have a first height H1 from the top surface 10a of the substrate 10. In the present specification, a height of a component may mean a maximum distance of the component measured in a direction perpendicular to the top surface 10a of the substrate 10. For example, the first height H1 may mean a vertical distance from the top surface 10a of the substrate 10 to the topmost surface of the heat dissipation layer 500 provided in the first region R1. The heat dissipation layer 500 provided in the second region R2 of the substrate 10 may have a second height H2 from the top surface 10a of the substrate 10. The second height H2 may mean a vertical distance from the top surface 10a of the substrate 10 to the topmost surface of the heat dissipation layer 500 provided in the second region R2. In some embodiments, the first height H1 may be different from the second height H2. For example, the first height H1 may be smaller than the second height H2. In some examples, the first height H1 may be greater than the second height H2.

Referring to FIGS. 2, 10 and 11, the heat dissipation layer 500 may include a conductive material. The heat dissipation layer 500 may be and/or include a metal such as copper (Cu), aluminum (Al), nickel (Ni), titanium (Ti), tungsten (W), tantalum (Ta), zinc (Zn), chromium (Cr), cobalt (Co), or alloys thereof. In some embodiments, the heat dissipation layer 500 may include a plurality of first particles P1 therein. The first particles P1 may include Cu. The first particles P1 may be in contact with each other to constitute the heat dissipation layer 500. Shapes of the first particles P1 may not be regular when viewed in a cross-sectional view. For example, the shapes of the first particles P1 may be distorted. The heat dissipation layer 500 may be formed by spraying metal powder at a high pressure. As a result, the metal powder may come in contact with a sprayed surface (e.g., the top surface 100a of the first chip 100), and thus shapes of particles of the metal powder may be deformed. The particles of the metal powder may be plastically deformed to form the first particles P1. For example, maximum widths of the first particles P1 may range from 0.1 μm to 500 μm. In certain embodiments, the first particles P1 may include grains therein. The first particles P1 may be in contact with each other. Contact surfaces of the first particles P1 may form a plurality of boundary lines BD in the heat dissipation layer 500. The boundary lines BD may be shown like a wave pattern provided in the heat dissipation layer 500 when viewed in a cross-sectional view. In certain embodiments, the heat dissipation layer 500 may further include second particles P2 different from the first particles P1. A thermal conductivity of the second particles P2 may be similar to a thermal conductivity of the first particles P1, and a coefficient of thermal expansion of the second particles P2 may be different from a coefficient of thermal expansion of the first particles P1. In some embodiments, the second particles P2 may include a material of which a thermal conductivity is higher than that of the first particles P1. In some examples, the second particles P2 may include silicon carbide (SiC). In some examples, the second particles P2 may include Al or boron (B). The second particles P2 may partially exist in the heat dissipation layer 500. For example, the second particles P2 may be surrounded by the first particles P1. According to some embodiments, the heat dissipation layer 500 may include the second particles P2 partially provided therein, and thus a warpage defect may be reduced or prevented. For example, a coefficient of thermal expansion of SiC is lower than that of Cu. Thus, the second particles P2 may include SiC to reduce a warpage defect of the heat dissipation layer 500. In certain embodiments, the heat dissipation layer 500 may include a magnetic shielding material for magnetic shielding to protect the mounted chips. For example, the magnetic shielding material may include a boron (B) compound. In certain embodiments, the heat dissipation layer 500 may include Al to improve an adhesive strength to cover the mounted chips. In certain embodiments, the spray nozzle NZ may spray the metal powder PT that includes at least two separate materials such as Cu and Al, Cu and SiC, Cu and B, and Cu, SiC and B to form the heat dissipation layer 500. In this case, the metal powder PT may include first and second particles P1 and P2 or first through n particles P1 through Pn (n is a positive integer greater than 2).

The semiconductor module 1 according to some embodiments may further include an electromagnetic blocking wall 400. The electromagnetic blocking wall 400 may be provided on the substrate 10. The electromagnetic blocking wall 400 may be disposed in a region between the first region R1 and the second region R2 of the substrate 10. The electromagnetic blocking wall 400 may be disposed between the first chip 100 and the passive devices 300 closest to the first chip 100. A top surface 400a of the electromagnetic blocking wall 400 may be covered by the heat dissipation layer 500. At least a portion of side surfaces of the electromagnetic blocking wall 400 may be covered by the heat dissipation layer 500. The heat dissipation layer 500 may vertically extend between the electromagnetic blocking wall 400 and the first chip 100 so as to be in contact with the top surface 10a of the substrate 10. The electromagnetic blocking wall 400 may be disposed between the first chip 100 and the second chip 200 or between the first chip 100 and the passive devices 300 to block electromagnetic waves. The electromagnetic blocking wall 400 may include a conductive material, for example, copper (Cu) or silver (Ag).

The semiconductor module 1 according to some embodiments may further include a dielectric layer 700 provided in the second region R2 of the substrate 10. The dielectric layer 700 may be disposed between the heat dissipation layer 500 and the second chip 200 and between the heat dissipation layer 500 and the passive devices 300. The dielectric layer 700 may be provided on the top surface 200a and the side surfaces 200c of the second chip 200. The dielectric layer 700 may be in contact with the top surface 200a and the side surfaces 200c of the second chip 200. The dielectric layer 700 may extend from the top surface 200a of the second chip 200 onto the side surfaces 200c of the second chip 200 and the top surfaces of the passive devices 300. The dielectric layer 700 may conformally cover the top surfaces and the side surfaces of the second chip 200 and the passive devices 300. The dielectric layer 700 may include an insulating material.

Figure 3:
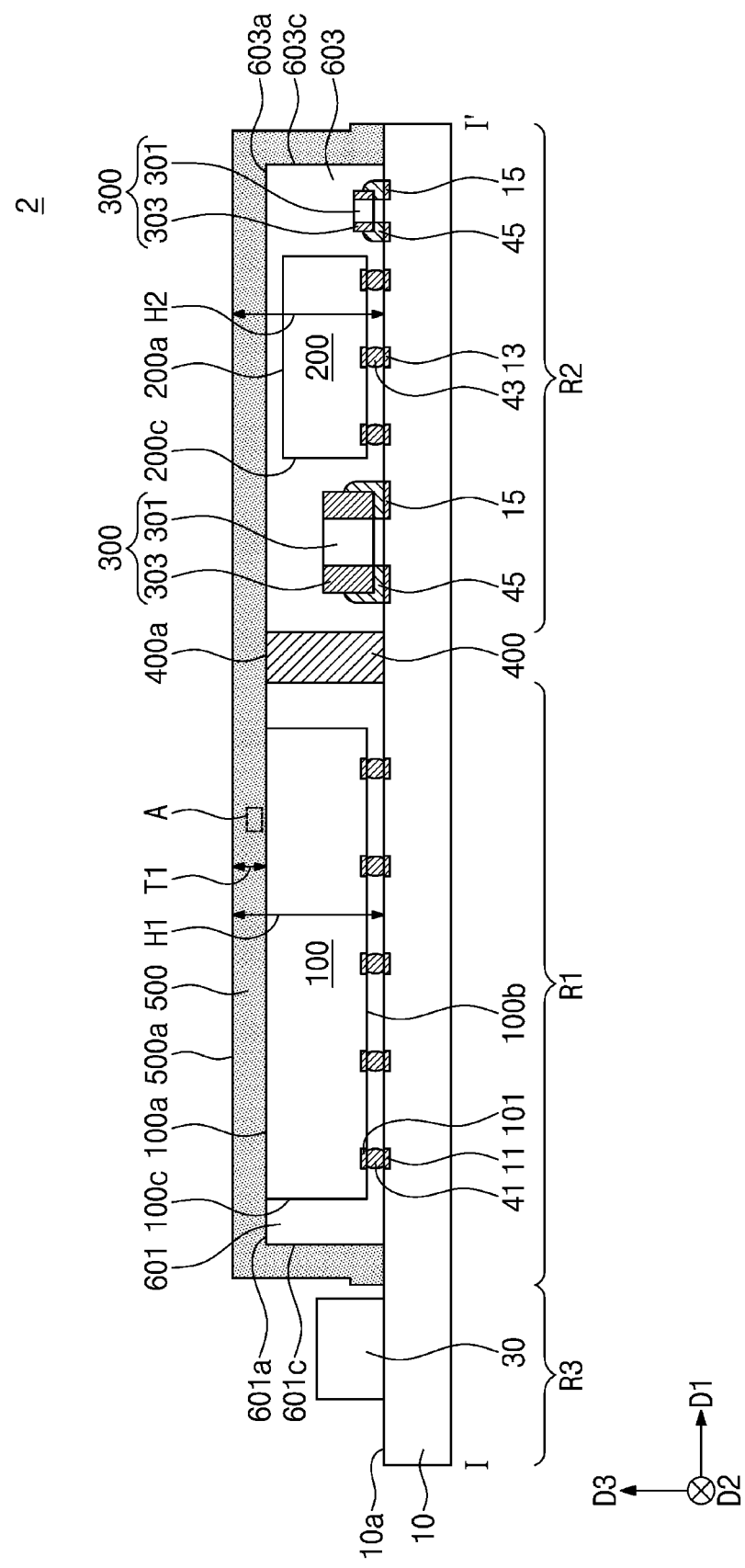
FIG. 3 is a cross-sectional view corresponding to the line I-I' of FIG. 1 to illustrate a semiconductor module according to some embodiments of the inventive concepts.

FIG. 3 is a cross-sectional view corresponding to the line I-I' of FIG. 1 to illustrate a semiconductor module according to some embodiments of the inventive concepts. Hereinafter, the descriptions to the same components and features as in the above embodiments will be omitted for the purpose of ease and convenience in explanation. In other words, differences between the present embodiments and the above embodiments will be mainly described.

Referring to FIG. 3, a semiconductor module 2 according to some embodiments may include a substrate 10, a first chip 100, a second chip 200, passive devices 300, an electromagnetic blocking wall 400, a heat dissipation layer 500, and molding layers 601 and 603. The substrate 10, the first chip 100, the second chip 200 and the passive devices 300 may be substantially the same as described with reference to FIGS. 1 and 2.

The molding layers 601 and 603 may be provided on the top surface 10a of the substrate 10. The molding layers 601 and 603 may include a first molding layer 601 and a second molding layer 603. The first molding layer 601 and the second molding layer 603 may be laterally spaced apart from each other. The electromagnetic blocking wall 400 may be disposed between the first molding layer 601 and the second molding layer 603. The first molding layer 601 may be provided in the first region R1 of the substrate 10. The first molding layer 601 may be provided between the bottom surface 100b of the first chip 100 and the top surface 10a of the substrate 10. The first molding layer 601 may vertically extend along the side surfaces 100c of the first chip 100. For example, the first molding layer 601 may be disposed between the heat dissipation layer 500 and one of the side surfaces 100c of the first chip 100. The first molding layer 601 may surround the first chip 100 but may expose the top surface 100a of the first chip 100. The top surface 601a of the first molding layer 601 may be coplanar with the top surface 100a of the first chip 100. The top surface 601a of the first molding layer 601 may be coplanar with a top surface 400a of the electromagnetic blocking wall 400. The first molding layer 601 may fully cover one side surface of the electromagnetic blocking wall 400 and may be in contact with the one side surface of the electromagnetic blocking wall 400. The first molding layer 601 may surround the first connection parts 41. The first molding layer 601 may include an insulating polymer such as an epoxy molding compound.

The second molding layer 603 may be provided in the second region R2 of the substrate 10. The second molding layer 603 may surround the second chip 200 and the passive devices 300. The second molding layer 603 may fully cover the other side surface of the electromagnetic blocking wall 400 and may be in contact with the other side surface of the electromagnetic blocking wall 400. The second molding layer 603 may cover the top surface 200a and the side surfaces 200c of the second chip 200. The second molding layer 603 may cover the top surfaces and the side surfaces of the passive devices 300. The second molding layer 603 may vertically extend between the second chip 200 and the passive devices 300 so as to be in contact with the top surface 10a of the substrate 10. The second molding layer 603 may cover the third connection parts 45. A top surface 603a of the second molding layer 603 may be coplanar with the top surface 400a of the electromagnetic blocking wall 400. The top surface 603a of the second molding layer 603 may be located at the same vertical level as the top surface 100a of the first chip 100 and the top surface 601a of the first molding layer 601. The second molding layer 603 may include the same material as the first molding layer 601. The second molding layer 603 may include an insulating polymer such as an epoxy molding compound.

The heat dissipation layer 500 may be provided in the first region R1 and the second region R2 of the substrate 10. The heat dissipation layer 500 may be provided on the top surface 100a of the first chip 100, the top surface 601a of the first molding layer 601, and the top surface 603a of the second molding layer 603. A top surface 500a of the heat dissipation layer 500 may be flat. For example, the top surface 500a of the heat dissipation layer 500 may be parallel to the top surface 10a of the substrate 10 with the same distance between the top surface 10a of the substrate 10 and the top surface 500a of the heat dissipation layer 500 in the first and second regions R1 and R2. The heat dissipation layer 500 may extend along one of the side surfaces 601c of the first molding layer 601 so as to be in contact with the top surface 10a of the substrate 10. The heat dissipation layer 500 may cover one of the side surfaces 601c of the first molding layer 601 but may not cover the other one of the side surfaces 601c, which is in contact with the electromagnetic blocking wall 400. The heat dissipation layer 500 may extend along one of the side surfaces 603c of the second molding layer 603 so as to be in contact with the top surface 10a of the substrate 10. The heat dissipation layer 500 may cover one of the side surfaces 603c of the second molding layer 603 but may not cover the other one of the side surfaces 603c, which is in contact with the electromagnetic blocking wall 400.

The heat dissipation layer 500 provided in the first region R1 of the substrate 10 may have a first height H1 from the top surface 10a of the substrate 10. The first height H1 may mean a vertical distance from the top surface 10a of the substrate 10 to the topmost surface of the heat dissipation layer 500 provided in the first region R1. The heat dissipation layer 500 provided in the second region R2 of the substrate 10 may have a second height H2 from the top surface 10a of the substrate 10. The second height H2 may mean a vertical distance from the top surface 10a of the substrate 10 to the topmost surface of the heat dissipation layer 500 provided in the second region R2. In some embodiments, the first height H1 may be equal to the second height H2.

Figure 4:
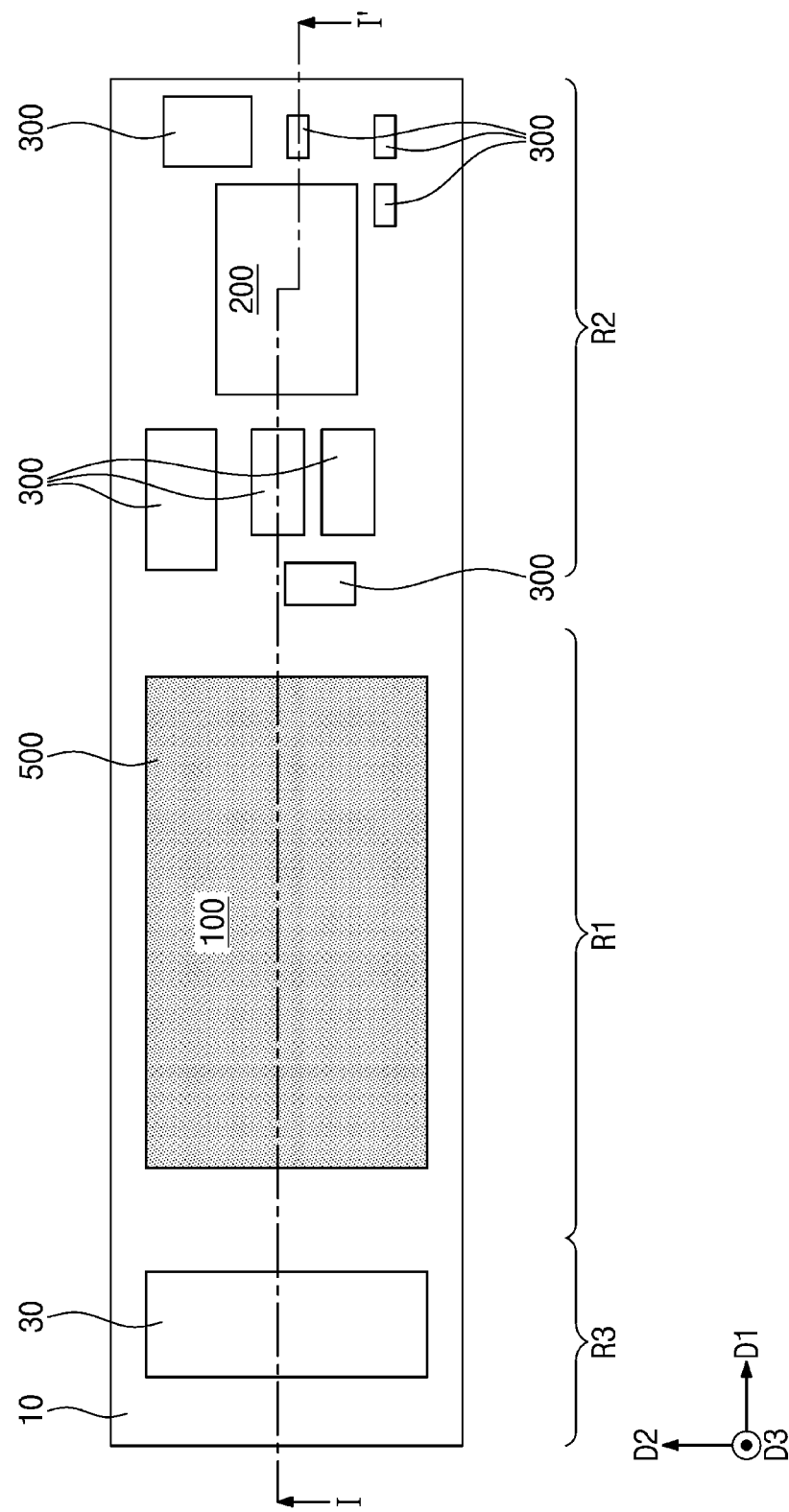
FIG. 4 is a plan view illustrating a semiconductor module according to some embodiments of the inventive concepts.
Figure 5:
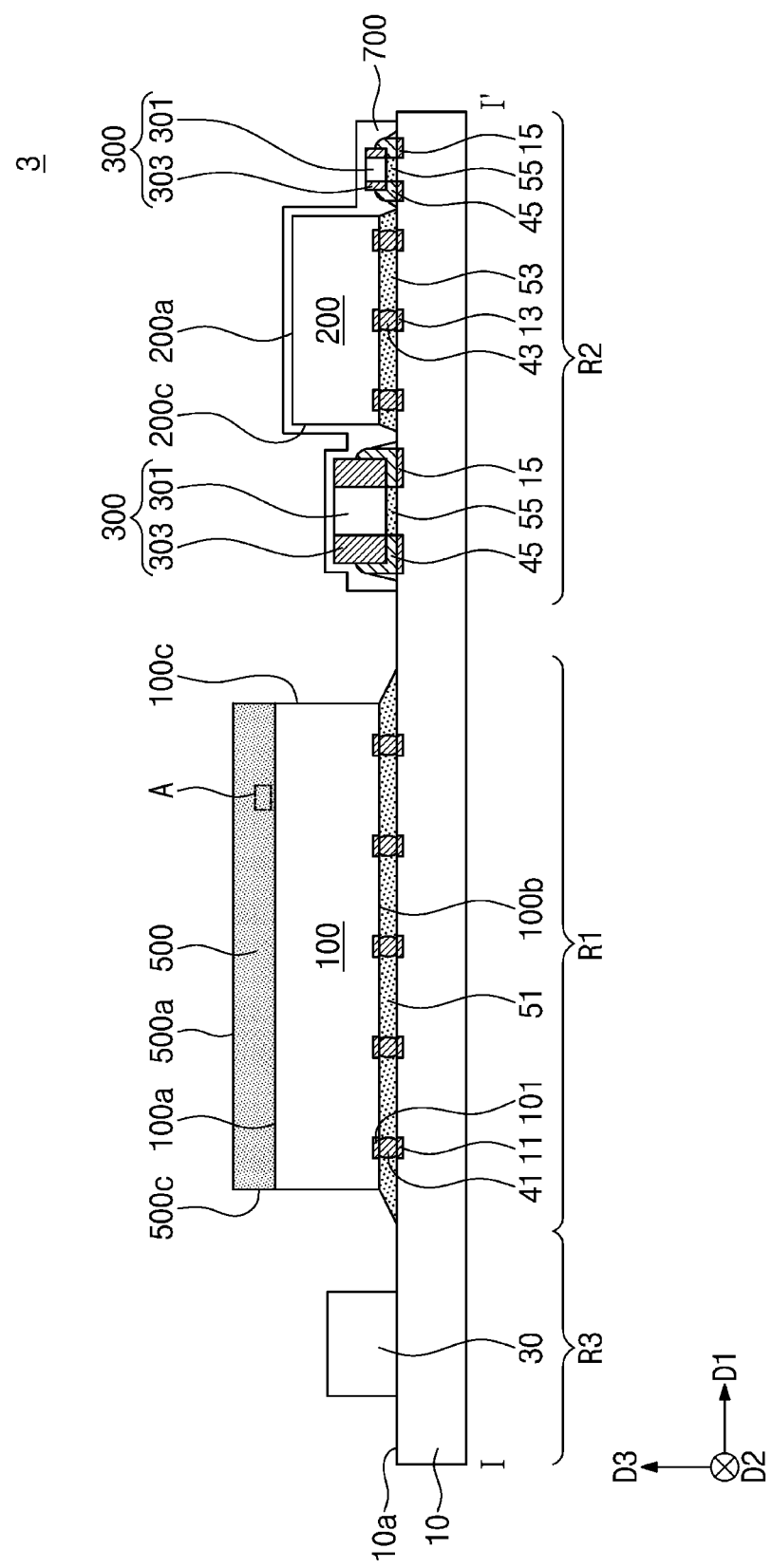
FIG. 5 is a cross-sectional view taken along a line I-I' of FIG. 4 according to example embodiments.

FIG. 4 is a plan view illustrating a semiconductor module according to some embodiments of the inventive concepts. FIG. 5 is a cross-sectional view taken along a line I-I' of FIG. 4 according to example embodiments. Hereinafter, the descriptions to the same components and features as in the above embodiments will be omitted for the purpose of ease and convenience in explanation. In other words, differences between the present embodiments and the above embodiments will be mainly described.

Referring to FIGS. 4 and 5, a semiconductor module 3 according to some embodiments may include a substrate 10, a first chip 100, a second chip 200, passive devices 300, and a heat dissipation layer 500. The substrate 10, the first chip 100, the second chip 200 and the passive devices 300 may be substantially the same as described with reference to FIGS. 1 and 2.

The heat dissipation layer 500 may be provided on the first chip 100. The heat dissipation layer 500 may cover the top surface 100a of the first chip 100. The heat dissipation layer 500 may fully cover the top surface 100a of the first chip 100 and may be in contact with the top surface 100a. A top surface 500a of the heat dissipation layer 500 may be parallel to the top surface 100a of the first chip 100. The top surface 500a of the heat dissipation layer 500 may be flat. The heat dissipation layer 500 may expose the side surfaces 100c of the first chip 100. The heat dissipation layer 500 may not be in contact with the side surfaces 100c of the first chip 100. Side surfaces 500c of the heat dissipation layer 500 may be vertically aligned with the side surfaces 100c of the first chip 100, respectively. The heat dissipation layer 500 may overlap the first chip 100 when viewed in a plan view. A planar area of the heat dissipation layer 500 may be equal to a planar area of the first chip 100.

Figure 6:
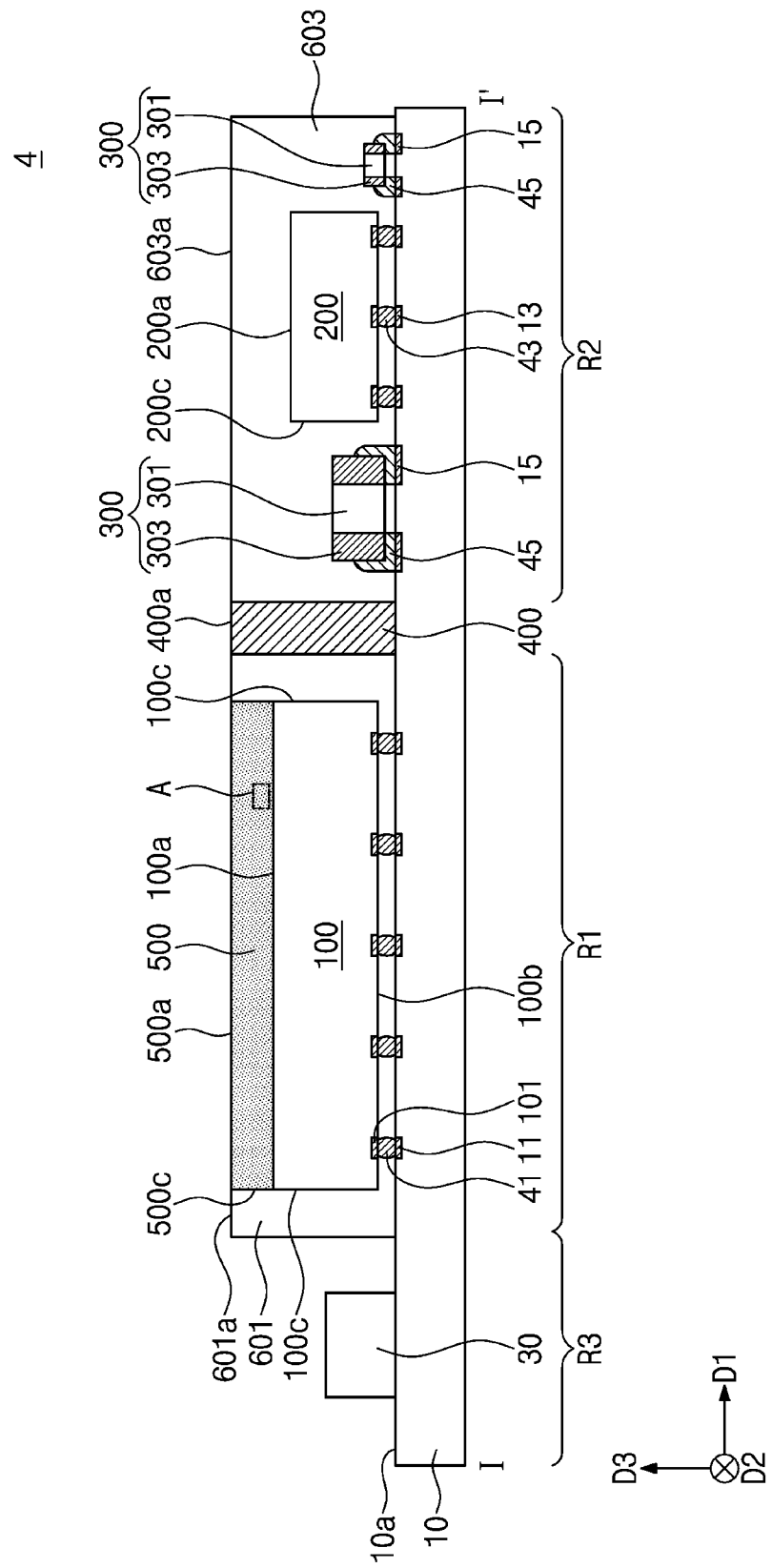
FIG. 6 is a cross-sectional view corresponding to the line I-I' of FIG. 4 to illustrate a semiconductor module according to some embodiments of the inventive concepts.

FIG. 6 is a cross-sectional view corresponding to the line I-I' of FIG. 4 to illustrate a semiconductor module according to some embodiments of the inventive concepts. Hereinafter, the descriptions to the same components and features as in the above embodiments will be omitted for the purpose of ease and convenience in explanation. In other words, differences between the present embodiments and the above embodiments will be mainly described.

Referring to FIG. 6, a semiconductor module 4 according to some embodiments may include a substrate 10, a first chip 100, a second chip 200, passive devices 300, an electromagnetic blocking wall 400, a heat dissipation layer 500, and molding layers 601 and 603. The substrate 10, the first chip 100, the second chip 200 and the passive devices 300 may be substantially the same as described with reference to FIGS. 1 and 2, and the heat dissipation layer 500 may be substantially the same as described with reference to FIG. 5.

The molding layers 601 and 603 may be provided on the top surface 10a of the substrate 10. The molding layers 601 and 603 may include a first molding layer 601 and a second molding layer 603. The first molding layer 601 may vertically extend along the side surfaces 100c of the first chip 100 to cover the side surfaces 100c of the first chip 100 and the side surfaces 500c of the heat dissipation layer 500. The first molding layer 601 may be in contact with the side surfaces 100c of the first chip 100 and the side surfaces 500c of the heat dissipation layer 500. The first molding layer 601 may surround the side surfaces 100c of the first chip 100 and the side surfaces 500c of the heat dissipation layer 500 but may expose the top surface 500a of the heat dissipation layer 500. The top surface 601a of the first molding layer 601 may be coplanar with the top surface 500a of the heat dissipation layer 500. The top surface 601a of the first molding layer 601 may be coplanar with the top surface 400a of the electromagnetic blocking wall 400. The first molding layer 601 may fully cover one side surface of the electromagnetic blocking wall 400 and may be in contact with the one side surface of the electromagnetic blocking wall 400. The first molding layer 601 may surround the first connection parts 41. The first molding layer 601 may include an insulating polymer such as an epoxy molding compound.

The second molding layer 603 may be provided in the second region R2 of the substrate 10. The second molding layer 603 may surround the second chip 200 and the passive devices 300. The second molding layer 603 may fully cover the other side surface of the electromagnetic blocking wall 400 and may be in contact with the other side surface of the electromagnetic blocking wall 400. The second molding layer 603 may cover the top surface 200a and the side surfaces 200c of the second chip 200. The second molding layer 603 may cover the top surfaces and the side surfaces of the passive devices 300. The second molding layer 603 may vertically extend between the second chip 200 and the passive devices 300 so as to be in contact with the top surface 10a of the substrate 10. The second molding layer 603 may cover the third connection parts 45. A top surface 603a of the second molding layer 603 may be coplanar with the top surface 400a of the electromagnetic blocking wall 400. The top surface 603a of the second molding layer 603 may be located at the same vertical level as the top surface 500a of the heat dissipation layer 500 and the top surface 601a of the first molding layer 601. The second molding layer 603 may include the same material as the first molding layer 601. The second molding layer 603 may include an insulating polymer such as an epoxy molding compound.

According to some embodiments of the inventive concepts, the heat dissipation layer 500 may be formed by a cold spray method. In the cold spray method, metal powder may be adhered onto a substrate by discharging the metal powder with a high-speed gas through a nozzle. The heat dissipation layer 500 may be selectively formed on a desired portion of the substrate 10 by the cold spray method. Particles of the metal powder may be plastically deformed and thus may be firmly fixed on exposed surfaces of the chips mounted on the substrate 10. For example, the heat dissipation layer 500 may be adhered without an additional adhesive material and may effectively cover the mounted chips. It may be understood that when heat is generated from the semiconductor module according to some embodiments, the heat may be generated from the first chip 100. For example, the heat dissipation layer 500 may be in contact with at least one of the top surface 100a and the side surfaces 100c of the first chip 100, and thus the heat may be effectively dissipated. In addition, a process cost of the cold spray method may be lower than that of a sputtering method, and thus a yield of the semiconductor modules may be improved at a low cost. For example, a manufacturing equipment for sputtering may need to be in a vacuum state. However, a manufacturing equipment for cold spraying may not need to be in a vacuum state, thus a cost of the manufacturing equipment for cold spraying may be less than a cost of the manufacturing equipment for sputtering.

[Manufacturing Method]

FIGS. 7A to 7E are views illustrating a method for manufacturing a semiconductor module, according to some embodiments of the inventive concepts.

Figure 7A:
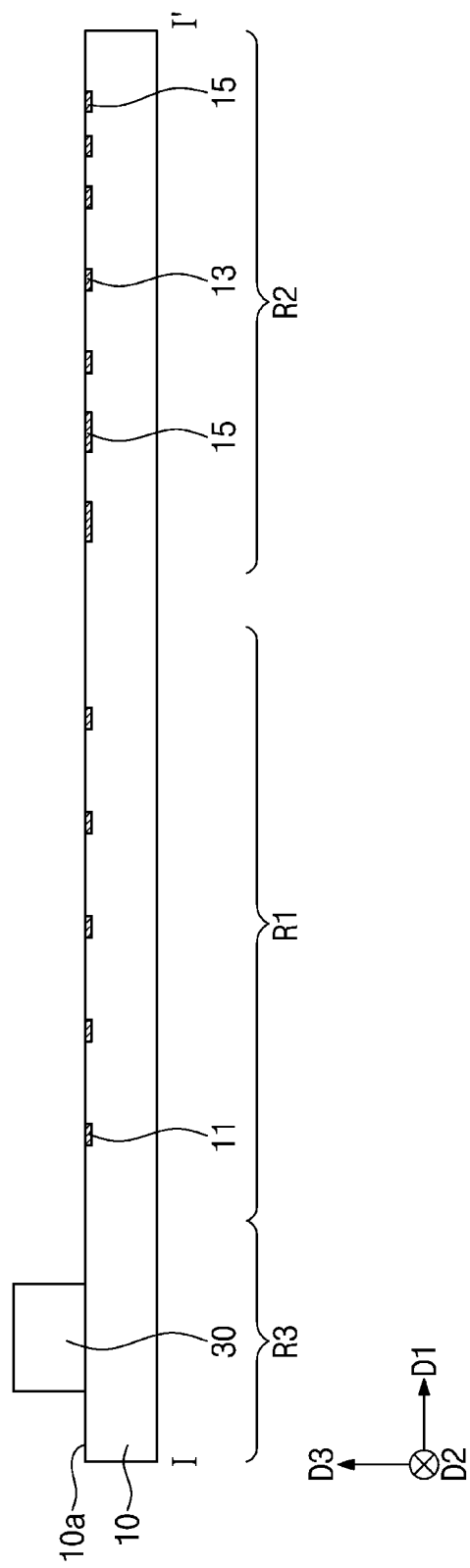
FIGS. 7A to 7E are views illustrating a method for manufacturing a semiconductor module, according to some embodiments of the inventive concepts.

Referring to FIG. 7A, a substrate 10 may be prepared. The substrate 10 may be a printed circuit board (PCB). The substrate 10 may include an antenna interconnection line therein to communicate outside of the semiconductor modules 1 through 4. For example, the antenna interconnection line may be formed of a line or some pattern. However, embodiments of the inventive concepts are not limited thereto. In certain embodiments, the antenna interconnection line may be omitted. The substrate 10 may include a plurality of substrate pads 11, 13 and 15. The substrate pads 11, 13 and 15 may be exposed at a top surface 10a of the substrate 10. The substrate 10 may include first, second and third regions R1, R2 and R3. A connection socket 30 may be formed in the third region R3 of the substrate 10.

Figure 7B:
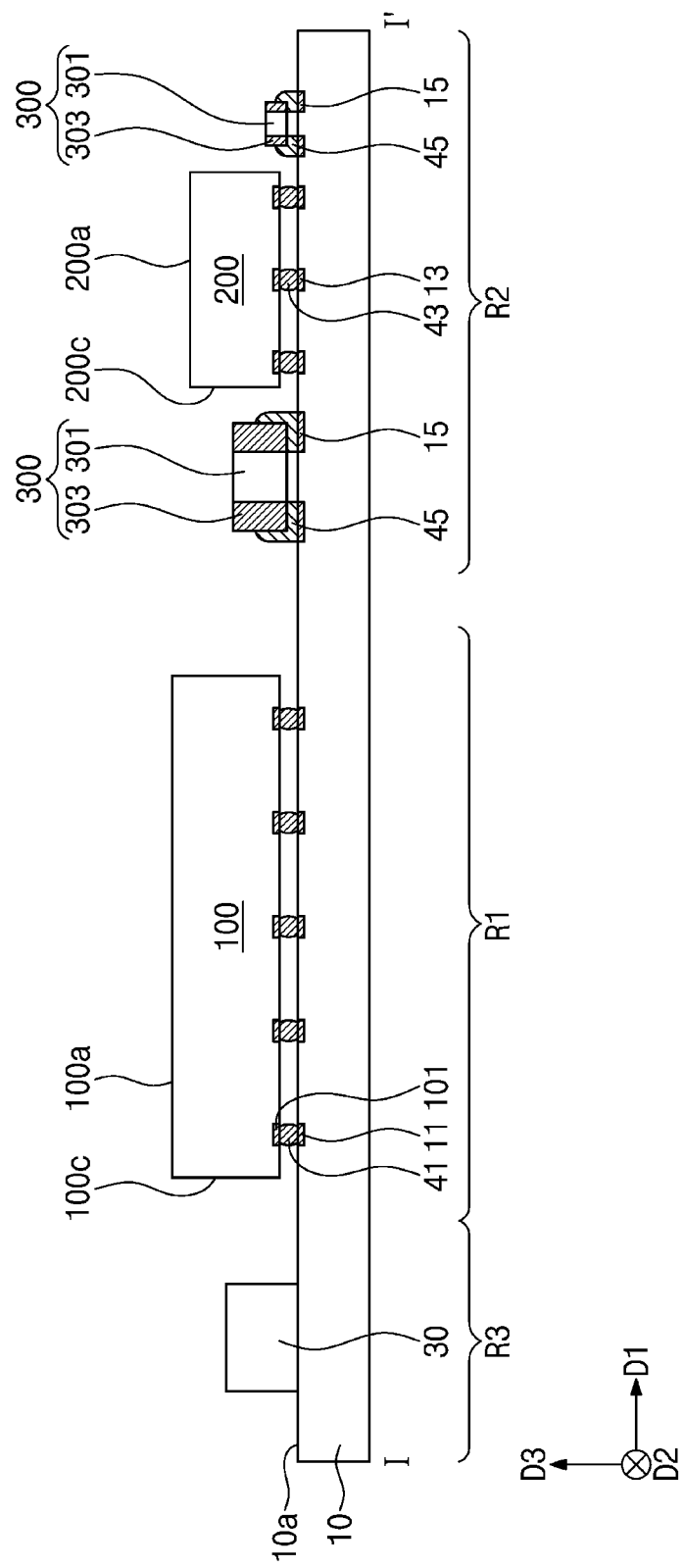

Referring to FIG. 7B, a first chip 100, a second chip 200 and passive devices 300 may be mounted on the top surface 10a of the substrate 10. More particularly, first chip pads 101 of the first chip 100 may be disposed on first substrate pads 11, respectively, and second chip pads 201 of the second chip 200 may be disposed on second substrate pads 13, respectively. A pair of electrodes 303 of each of the passive devices 300 may be disposed on third substrate pads 15, respectively. First connection parts 41, second connection parts 43 and third connection parts 45 may electrically connect the first chip 100, the second chip 200 and the passive devices 300 to the substrate 10, respectively.

Figure 7C:
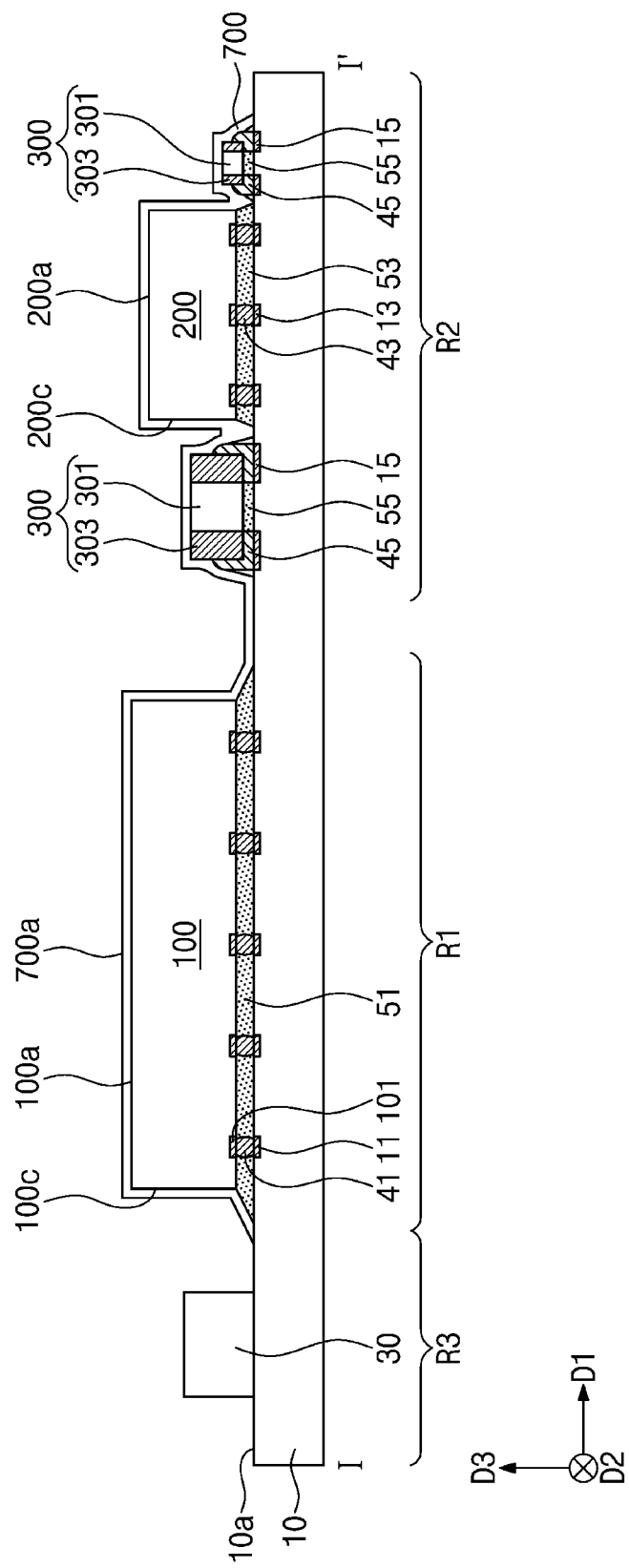

Referring to FIG. 7C, an underfill process may be performed to form a first underfill 51, a second underfill 53, and a third underfill 55 on the top surface 10a of the substrate 10. The first underfill 51, the second underfill 53 and the third underfill 55 may be formed by a process of thermally compressing non-conductive paste or a non-conductive film or by a capillary underfill process. After the underfill process, a dielectric layer 700 may be conformally deposited to cover the first region R1 and the second region R2 of the substrate 10. In certain embodiments, the dielectric layer 700 may be formed on only the first and second regions R1 and R2 by spraying the insulating material in a state in which a mask covers the third region R3 of the substrate 10. The dielectric layer 700 may be formed by depositing an insulating material on the substrate 10. For example, the dielectric layer 700 may be formed by spraying the insulating material on the substrate 10. The dielectric layer 700 may cover exposed surfaces 100a and 100c of the first chip 100, 200a and 200c of the second chip 200 and the passive devices 300. A top surface 700a of the dielectric layer 700 may not be parallel to the top surface 10a of the substrate 10.

Figure 7D:
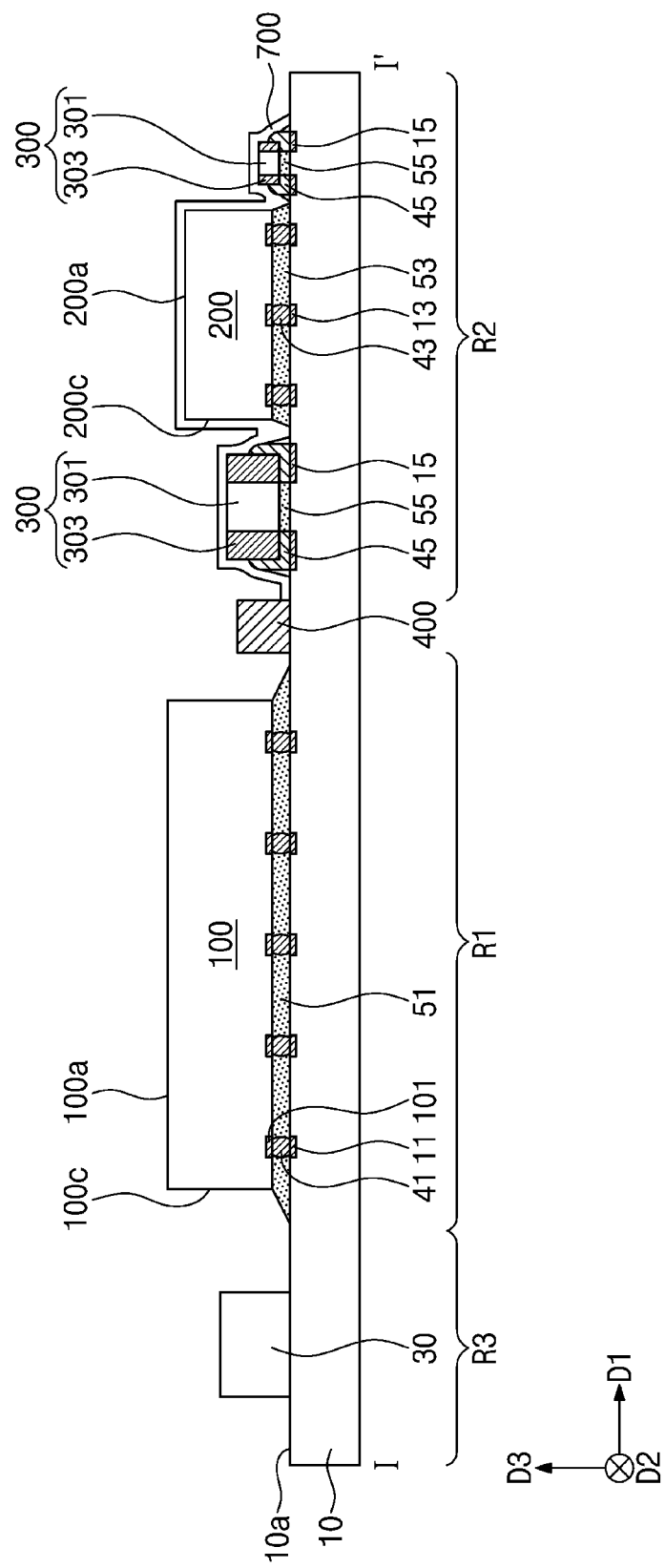

Referring to FIG. 7D, the dielectric layer 700 provided in the first region R1 of the substrate 10 may be removed. For example, the dielectric layer 700 may be removed using laser. In certain embodiments, the dielectric layer 700 may be formed on only the second region R2 by spraying the insulating material in a state in which a mask covers the first and third regions R1 and R3 of the substrate 10. An electromagnetic blocking wall 400 may be formed in a region between the first region R1 and the second region R2 of the substrate 10. The electromagnetic blocking wall 400 may include a conductive material such as copper (Cu) or silver (Ag). In certain embodiments, the electromagnetic blocking wall 400 may include copper (Cu) and silver (Ag).

Figure 7E:
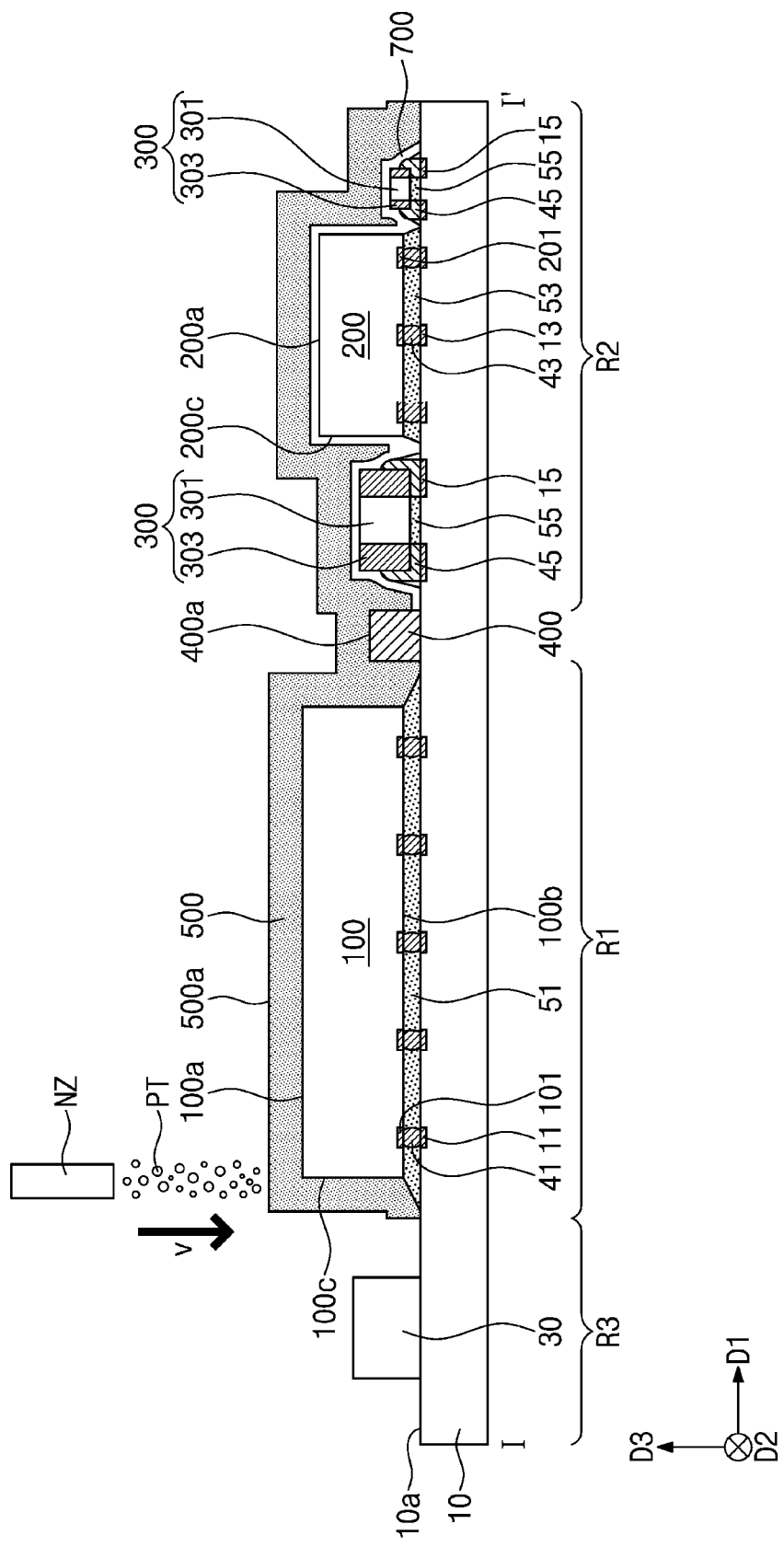

Referring to FIG. 7E, a heat dissipation layer 500 may be formed in the first region R1 and the second region R2 of the substrate 10. The heat dissipation layer 500 may be formed by a cold spray method. The cold spray method may include spraying metal powder PT with a high-pressure gas at a high speed to form a metal layer. The speed V at which the metal powder PT is sprayed may be, for example, a sound speed. More particularly, the metal powder PT and the gas may be mixed with each other through a spray nozzle NZ and then may be sprayed from the spray nozzle NZ toward the substrate 10. For example, the gas may include nitrogen, air, and/or helium. The spray nozzle NZ may form the heat dissipation layer 500 while horizontally moving over the substrate 10. A deposition rate of the heat dissipation layer 500 may be changed depending on a movement speed of the spray nozzle NZ. The semiconductor module 1 of FIG. 2 may be manufactured through the processes described above.

In some embodiments, the heat dissipation layer 500 may be formed in only the first and second regions R1 and R2 by spraying the metal powder PT in a state in which a mask covers the third region R3 of the substrate 10 or the spray nozzle NZ moves in only the first and second regions R1 and R2 of the substrate 10.

In certain embodiments, the metal powder PT spraying by the spray nozzle NZ may include at least one of Cu, Al, Ni, Ti, W, Ta, Zn, Cr and Co. For example, the metal powder PT may include Cu and Al.

In certain embodiments, the metal powder PT spraying by the spray nozzle NZ may include at least one of Cu, Al, Ni, Ti, W, Ta, Zn, Cr and Co and further include at least one of SiC and B. For example, the metal powder PT may include Cu and SiC or Cu and B.

FIGS. 8A to 8D are views illustrating a method for manufacturing a semiconductor module, according to some embodiments of the inventive concepts. Hereinafter, the descriptions to the same features as in the above embodiments will be omitted for the purpose of ease and convenience in explanation. In other words, differences between the present embodiments and the above embodiments will be mainly described.

Figure 8A:
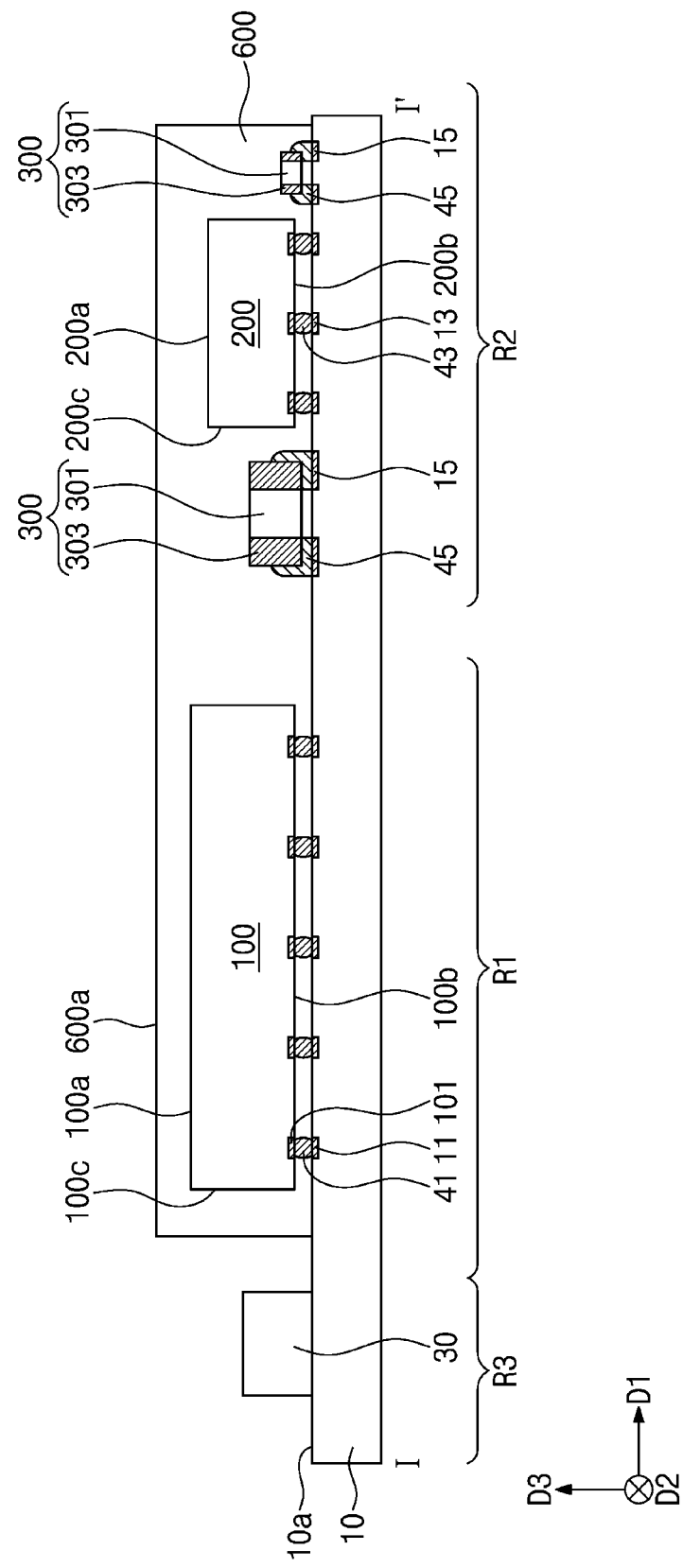
FIGS. 8A to 8D are views illustrating a method for manufacturing a semiconductor module, according to some embodiments of the inventive concepts.

Referring to FIG. 8A, the substrate 10 on which the first chip 100, the second chip 200 and the passive devices 300 are mounted may be prepared. The first chip 100, the second chip 200 and the passive devices 300 in FIG. 8A may be mounted by the same method as described with reference to FIGS. 7A and 7B. A molding layer 600 may be formed in the first region R1 and the second region R2 of the substrate 10. The molding layer 600 may cover the top surface 100a, the bottom surface 100b and the side surfaces 100c of the first chip 100. The molding layer 600 may cover the top surface 200a, the bottom surface 200b and the side surfaces 200c of the second chip 200. The molding layer 600 may cover at least a portion of the top surfaces, the side surfaces and the bottom surfaces of the passive devices 300.

Figure 8B:
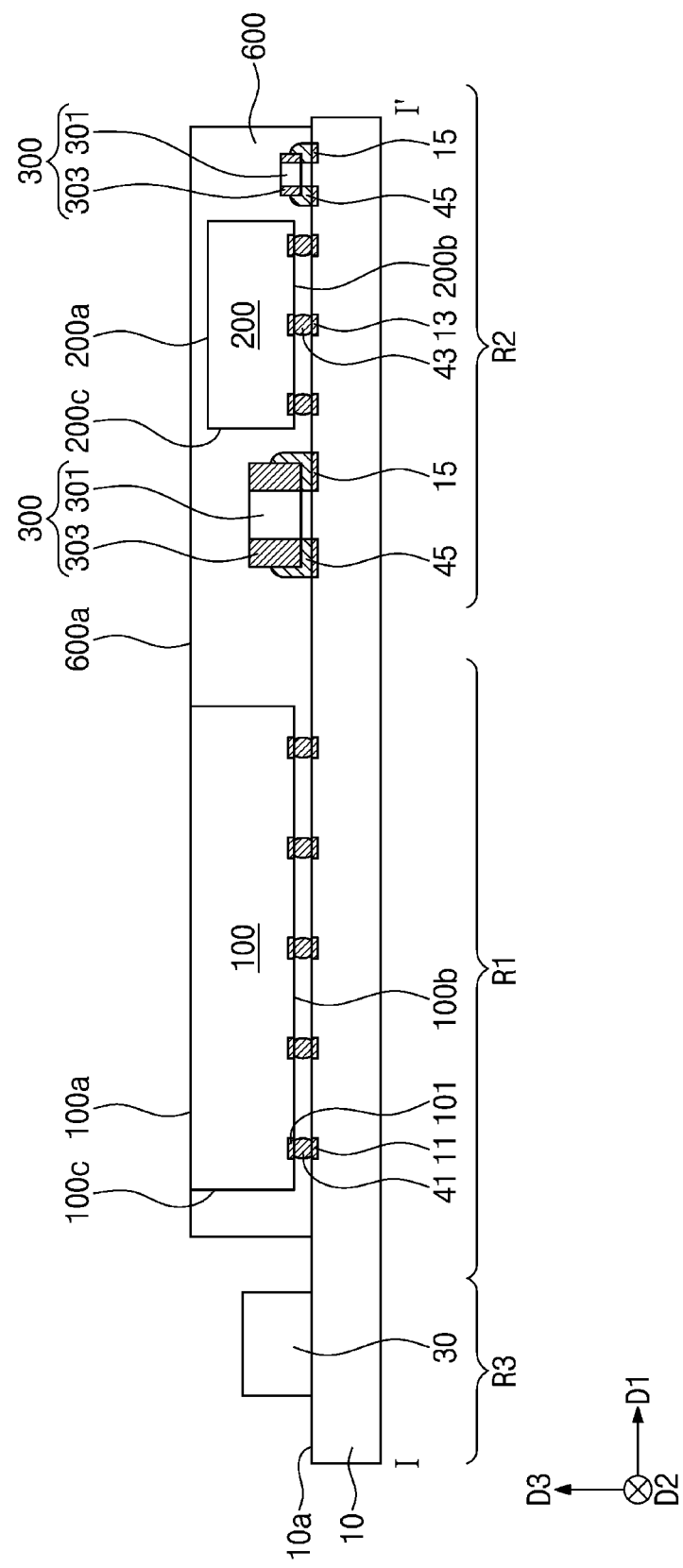

Referring to FIG. 8B, a process for removing an upper portion of the molding layer 600 may be performed on a top surface 600a of the molding layer 600. For example, the process for removing the upper portion of the molding layer 600 may be performed by a method using laser, a sand blasting method of spraying sand onto the molding layer 600 at a high pressure, or a method of physically polishing the top surface of the molding layer 600. The removal of the upper portion of the molding layer 600 may be performed until the top surface 100a of the first chip 100 is exposed. Since the molding layer 600 provided on the top surface 100a of the first chip 100 is removed by the removal process, heat emitted from the first chip 100 may be effectively transferred to the outside. A roughness of the top surface 100a of the first chip 100 may be improved through the removal process. Thus, the fixing force between the top surface 100a of the first chip 100 and the heat dissipation layer 500 may be increased. In certain embodiments, a small portion of the molding layer 600 may be remained on the top surface 100a of the first chip 100.

Figure 8C:
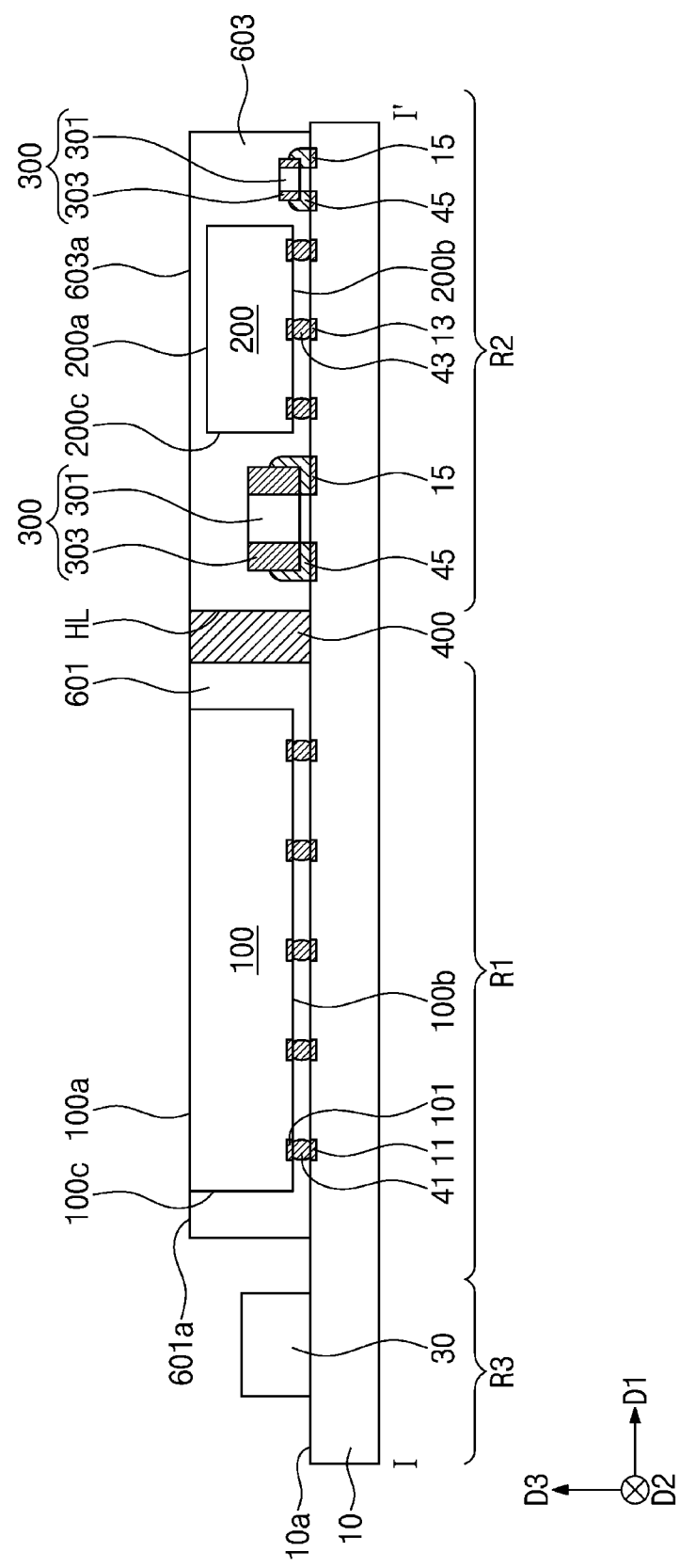

Referring to FIG. 8C, a through-hole HL may be formed to penetrate the molding layer 600. The through-hole HL may be provided in a region between the first region R1 and the second region R2 of the substrate 10. The through-hole HL may be formed by irradiating laser onto the top surface 600a of the molding layer 600. An electromagnetic blocking wall 400 may be formed by filling the through-hole HL with metal paste. The metal paste may include silver (Ag). A first molding layer 601 and a second molding layer 603 which are laterally spaced apart from each other may be formed by the electromagnetic blocking wall 400.

Figure 8D:
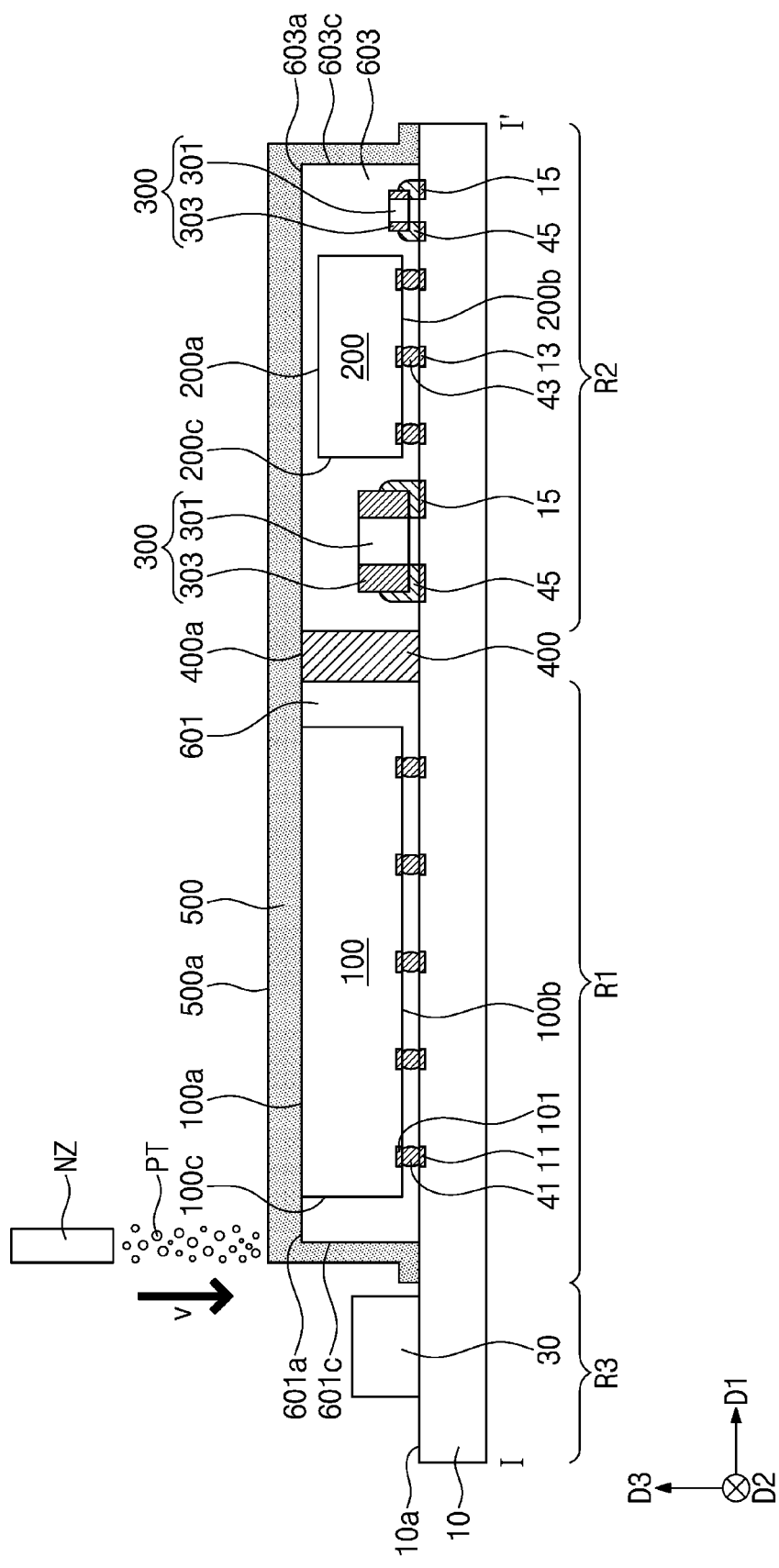

Referring to FIG. 8D, a heat dissipation layer 500 may be formed in the first region R1 and the second region R2 of the substrate 10. The heat dissipation layer 500 may be formed using the cold spray method described with reference to FIG. 7E. The heat dissipation layer 500 may be formed on the top surface 100a of the first chip 100, the top surface 601a of the first molding layer 601, and a top surface 603a of the second molding layer 603. The heat dissipation layer 500 may also be formed on one of the side surfaces 601c of the first molding layer 601 and one of the side surfaces 603c of the second molding layer 603. A top surface 500a of the heat dissipation layer 500 may be parallel to the top surface 10a of the substrate 10 with the same distance between the top surface 10a of the substrate 10 and the top surface 500a of the heat dissipation layer 500 in the first and second regions R1 and R2. For example, the heat dissipation layer 500 may fully cover the first region R1 and the second region R2. The semiconductor module 2 of FIG. 3 may be manufactured through the processes described above.

Figure 9A:
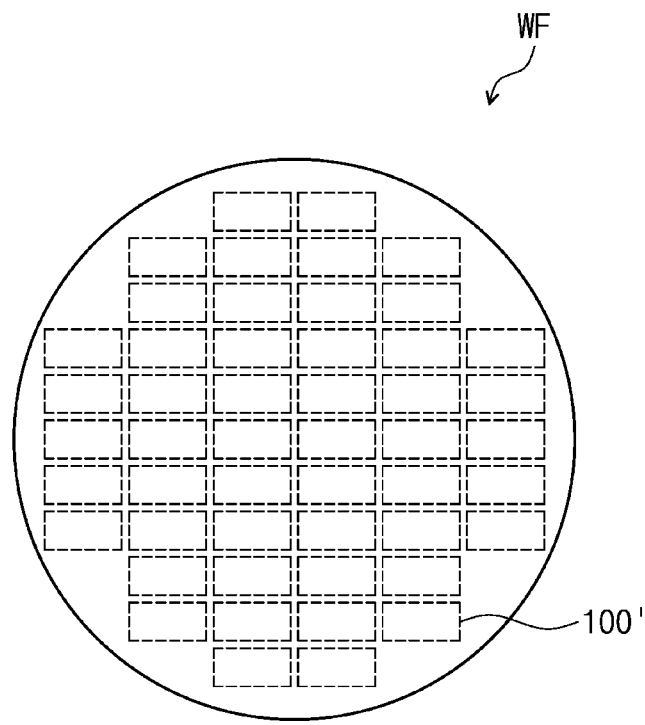
FIGS. 9A to 9C are views illustrating a method for manufacturing a semiconductor module, according to some embodiments of the inventive concepts.
Figure 9B:
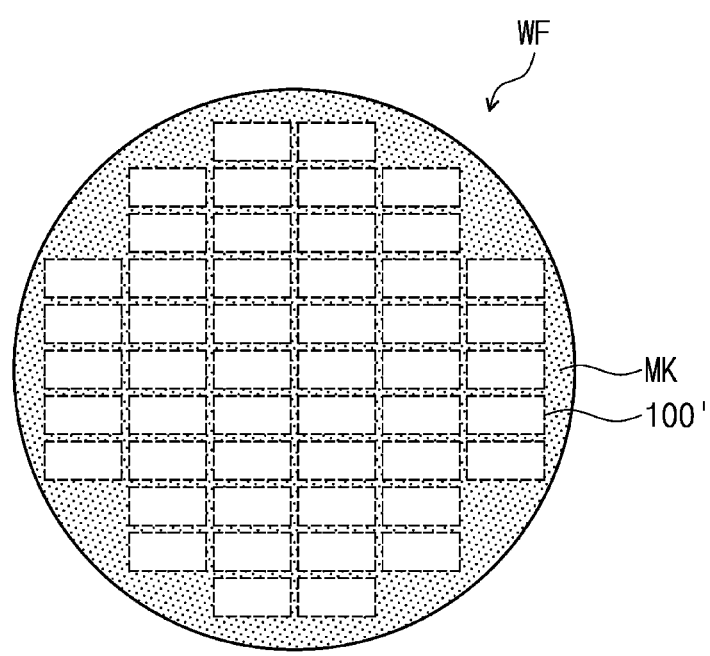
Figure 9C:
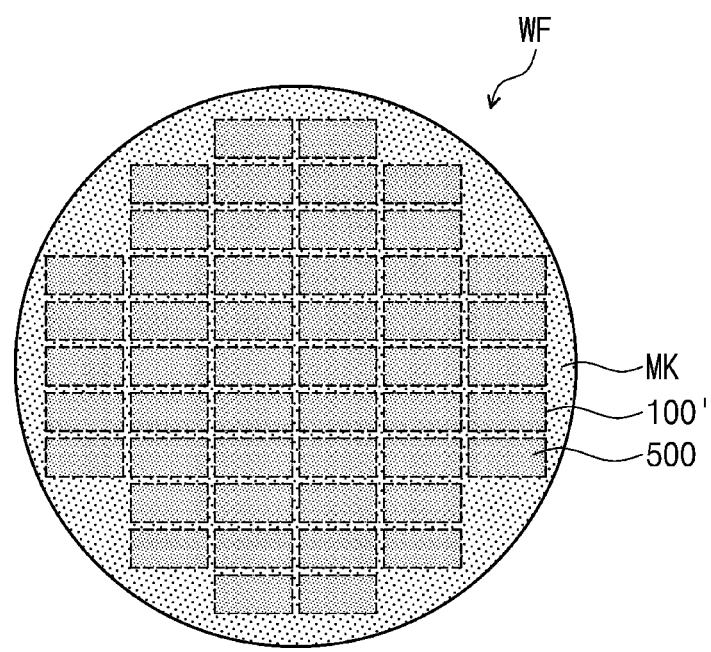

FIGS. 9A to 9C are views illustrating a method for manufacturing a semiconductor module, according to some embodiments of the inventive concepts. Hereinafter, the descriptions to the same features as in the above embodiments will be omitted for the purpose of ease and convenience in explanation. In other words, differences between the present embodiments and the above embodiments will be mainly described.

Referring to FIGS. 9A to 9C, a wafer WF for forming a plurality of first chips 100 may be prepared. A mask MK may be formed on one surface of the wafer WF. The mask MK may include, for example, a metal. The mask MK may cover the one surface of the wafer WF but may not cover exposure regions 100'. The exposure regions 100' may become the top surfaces 100a of the first chips 100. A cold spray process may be performed on the one surface of the wafer WF to form a heat dissipation layer 500. The mask MK may block metal powder sprayed to the one surface of the wafer WF during the cold spray process. Thus, the heat dissipation layer 500 may be formed on the exposure regions 100'. The wafer WF may be sawed to separate the first chips 100 having the heat dissipation layers 500 from each other.

Referring again to FIG. 5, the first chip 100 having the heat dissipation layer 500 may be mounted in the first region R1 of the substrate 10. Thereafter, the dielectric layer 700 and the first to third underfills 51, 53 and 55 may be formed by the same method as described with reference to FIGS. 7C and 7D. The semiconductor module 3 of FIG. 5 may be manufactured through the processes described above.

Referring again to FIG. 6, the first chip 100 having the heat dissipation layer 500 may be mounted in the first region R1 of the substrate 10. Thereafter, the first molding layer 601, the second molding layer 603 and the electromagnetic blocking wall 400 may be formed by the same method as described with reference to FIGS. 8A to 8C. The top surface 601a of the first molding layer 601 may be coplanar with the top surface 500a of the heat dissipation layer 500. The semiconductor module 4 of FIG. 6 may be manufactured through the processes described above.

The semiconductor modules described with reference to FIGS. 1 to 6 may be manufactured by some embodiments described above.

The semiconductor module according to some embodiments may include the heat dissipation layer covering the first chip and the second chip on the substrate. The heat dissipation layer may be in contact with the top surface and the side surfaces of the first chip and may be disposed on the top surfaces and the side surfaces of the first and second chips. Thus, heat dissipation characteristics of the semiconductor module according to the embodiments may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. For example, the scopes of the inventive concepts are to be determined by the broadest permissible interpretation of the following claims and their equivalents, and shall not be restricted or limited by the foregoing description.

What is claimed is:

1. A semiconductor module comprising:
   a substrate including a first region and a second region;
   a first chip mounted in the first region;
   a second chip and passive devices mounted in the second region; and
   a heat dissipation layer being in contact with a top surface of the first chip,
   wherein the heat dissipation layer is provided on top surfaces and side surfaces of the first chip, the second chip and the passive devices.

2. The semiconductor module of claim 1, wherein the heat dissipation layer vertically extends to be in contact with the top surface of the substrate.

3. The semiconductor module of claim 1, wherein the heat dissipation layer in the first region of the substrate has a first height from the top surface of the substrate to the top surface of the heat dissipation layer,
   wherein the heat dissipation layer in the second region of the substrate has a second height from the top surface of the substrate to the top surface of the heat dissipation layer, and
   wherein the first height is different from the second height.

4. The semiconductor module of claim 1, wherein the heat dissipation layer is and/or includes at least one of copper (Cu), aluminum (Al), nickel (Ni), titanium (Ti), tungsten (W), tantalum (Ta), zinc (Zn), chromium (Cr), cobalt (Co), Boron (B), and silicon carbide (SiC).

5. The semiconductor module of claim 1, wherein a thickness of the heat dissipation layer provided on the top surface of the first chip ranges from 1 μm to 1 mm.

6. The semiconductor module of claim 1, wherein the heat dissipation layer surrounds the side surfaces of the first chip when viewed in a plan view.

7. The semiconductor module of claim 1, wherein the heat dissipation layer includes a plurality of particles therein.

8. The semiconductor module of claim 1, wherein the substrate includes an antenna interconnection line therein.

9. The semiconductor module of claim 1, further comprising:
   an electromagnetic blocking wall provided on the substrate,
   wherein the electromagnetic blocking wall is disposed in a region between the first region and the second region of the substrate.

10. The semiconductor module of claim 9, wherein the heat dissipation layer is in direct contact with the side surfaces of the first chip.

11. The semiconductor module of claim 1, further comprising:
   a first molding layer provided in the first region of the substrate,
   wherein the first molding layer is provided between a bottom surface of the first chip and the top surface of the substrate and vertically extends between the heat dissipation layer and the side surfaces of the first chip.

12. The semiconductor module of claim 11, wherein the top surface of the first molding layer is coplanar with the top surface of the first chip.

13. The semiconductor module of claim 11, further comprising:
a second molding layer surrounding the second chip and the passive devices,
wherein a top surface of the second molding layer is located at the same vertical level as the top surface of the first chip.

14. A semiconductor module comprising:
a substrate including a first region and a second region;
a first chip mounted in the first region;
a heat dissipation layer covering a top surface of the first chip; and
a second chip and passive devices mounted in the second region,
wherein side surfaces of the heat dissipation layer are vertically aligned with side surfaces of the first chip, respectively, and
wherein the heat dissipation layer includes a plurality of particles, and the particles include silicon carbide (SiC).

15. The semiconductor module of claim 14, wherein the heat dissipation layer is in contact with the top surface of the first chip and exposes the side surfaces of the first chip.

16. The semiconductor module of claim 14, further comprising:
an electromagnetic blocking wall disposed in a region between the first region and the second region of the substrate,
wherein a top surface of the electromagnetic blocking wall is located at a same level as a top surface of the heat dissipation layer.

17. The semiconductor module of claim 14, further comprising:
a first molding layer surrounding the side surfaces and a bottom surface of the first chip; and
a second molding layer covering the second chip and the passive devices,
wherein a top surface of the first molding layer and a top surface of the second molding layer are located at a same level as a top surface of a heat dissipation layer.

18. The semiconductor module of claim 14, wherein a planar area of the heat dissipation layer is equal to a planar area of the first chip.

19. A semiconductor module comprising:
a substrate including a first region, a second region, and a third region, the first region laterally disposed between the second region and the third region;
a first chip mounted in the first region;
a second chip and passive devices mounted in the second region;
an electromagnetic blocking wall provided in a region between the first region and the second region of the substrate;
first connection parts electrically connecting the first chip to the substrate;
second connection parts electrically connecting the second chip to the substrate;
third connection parts electrically connecting the passive devices to the substrate;
underfills covering the first to third connection parts;
a dielectric layer conformally covering top surfaces and side surfaces of the second chip and the passive devices; and
a heat dissipation layer covering the dielectric layer, the first chip, and the electromagnetic blocking wall.

20. The semiconductor module of claim 19, further comprising:
first substrate pads, second substrate pads and third substrate pads provided on the substrate; and
a connection socket provided in the third region of the substrate,
wherein the first chip includes first chip pads, the second chip includes second chip pads, and each of the passive devices includes a pair of electrodes,
wherein the first connection parts electrically connect the first substrate pads to the first chip pads, respectively,
wherein the second connection parts electrically connect the second substrate pads to the second chip pads, respectively, and
wherein the third connection parts electrically connect the third substrate pads to the pair of electrodes, respectively.

* * * * *